United States Patent
Wolkstein et al.

(10) Patent No.: US 6,909,235 B2
(45) Date of Patent: Jun. 21, 2005

(54) POWER REGULATOR FOR INTERMITTENT USE OF TRAVELING WAVE TUBE AMPLIFIERS IN COMMUNICATIONS SATELLITES

(75) Inventors: Herbert J. Wolkstein, Livingston, NJ (US); Douglas Vernon McKinnon, Montgomery Township, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/639,927

(22) Filed: Aug. 12, 2003

(65) Prior Publication Data

US 2004/0032295 A1 Feb. 19, 2004

Related U.S. Application Data

(60) Provisional application No. 60/402,913, filed on Aug. 14, 2002.

(51) Int. Cl.[7] .............................................. H01J 25/34
(52) U.S. Cl. ...................... 315/3.5; 315/5.38; 330/44; 330/127
(58) Field of Search ............................ 315/3.5, 5.38, 315/39.3; 330/42–44, 127

(56) References Cited

U.S. PATENT DOCUMENTS

| | | | | |
|---|---|---|---|---|
| 3,812,395 A | * | 5/1974 | Scott | 315/3.6 |
| 5,461,282 A | * | 10/1995 | Scheitrum et al. | 315/5.31 |
| 5,550,432 A | * | 8/1996 | Barker | 315/5 |
| 5,932,972 A | * | 8/1999 | Symons | 315/5.16 |
| 6,111,358 A | * | 8/2000 | Cardwell et al. | 315/3.5 |
| 6,285,254 B1 | * | 9/2001 | Chen et al. | 330/149 |
| 6,356,022 B1 | * | 3/2002 | Kosmahl | 315/3.5 |
| 6,356,023 B1 | * | 3/2002 | Kosmahl | 315/3.5 |
| 6,498,532 B2 | * | 12/2002 | Goren et al. | 330/43 |
| 6,590,450 B2 | * | 7/2003 | Chen et al. | 330/149 |
| 6,617,791 B2 | * | 9/2003 | Symons | 315/5.38 |

OTHER PUBLICATIONS

Wolkstein, "Design Considerations for Grid–Controlled Electron Guns for Pulsed Traveling–Wave Tubes," RCA Electron Tube Division, Morrison, N.J., Sep. 1960, pp 389–413.

* cited by examiner

*Primary Examiner*—Thuy Vinh Tran
(74) *Attorney, Agent, or Firm*—McDermott Will & Emery LLP

(57) ABSTRACT

A traveling wave tube (TWT) amplifier includes a beam forming electrode (BFE) and a BFE modulator having a bias-based keyer so that the TWT amplifier signals are keyed off during periods when RF power is not to be amplified. Biasing the beam forming electrode voltage off relative to cathode voltage effectively shuts down the electron beam without shutting down the power supply minimizes power supply stress and significantly improves reliability, so that low-level RF signal input is not amplified, and no significant RF power is output. Likewise, given that no amplification has taken place, no power associated with the TWT amplification function is consumed. Thus, the only power consumed by the TWT amplifier is that associated with the cathode heater and the electronic power conditioner (EPC) used as the electron beam source.

9 Claims, 4 Drawing Sheets

|  | CASE: 1 AMPLIFIERS LEFT ON AT ALL TIMES | CASE 2: DRIVER AMPLIFIERS TURNED OFF WHEN POSSIBLE | CASE 3: WITH INVENTION | DELTA CASE 1 vs CASE 3 | DELTA CASE 2 vs CASE 3 |
|---|---|---|---|---|---|
| MAXIMUM POWER (W) | 2536 | 2536 | 2536 | 0% | 0% |
| MINIMUM POWER (W) | 2536 | 1559 | 731 | −71% | −53% |
| AVERAGE POWER (W) | 2536 | 2016 | 1625 | −36% | −19% |
| ECLIPSE POWER, 50% TRAFFIC (W) | 2483 | 1988 | 1712 | −31% | −14% |

POWER REGULATOR FOR INTERMITTENT USE OF TRAVELING WAVE TUBE AMPLIFIERS IN COMMUNICATIONS SATELLITES

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

BACKGROUND OF THE INVENTION

This invention relates to improvements in power consumption of intermittently-operated traveling wave tube based amplifiers, particularly as used in satellite systems.

Amplifiers based on traveling wave tubes have numerous applications in wireless telecommunications and radar systems. Satellite communication is one class of applications, which, because of high efficiency and high reliability requirements, presents unique environmental constraints. On many satellites, traveling wave tube amplifiers, or TWTAs, are used to amplify low-level communication signals such that they can be transmitted to distant ground and/or space stations. For many satellite communication applications, TWTAs are the amplifier technology of choice because of their relatively high power and high conversion efficiency.

A satellite's cost is directly related to the amount of power and the thermal rejection capacity it must have. The amount of power required dictates the size and cost of the solar arrays, batteries and power conversion electronics that make up a satellite's power subsystem. The amount of thermal rejection capacity required dictates the size of the satellite's thermal radiators and the number of heat pipes, heaters and thermal blankets required in its thermal subsystem. In addition to the basic cost of these components, their mass directly affects cost of a satellite system since the cost of the required launch vehicle is directly related to the mass of the payload, such as a satellite.

FIG. 1 illustrates characteristics of the trajectory of an idealized non-geosynchronous orbiting (NGSO) satellite, which is a primary application of the present invention, showing a satellite 12 in positions A and B in line of sight with a tracking ground station 14 on earth 16. It will be noted that the satellite is in view of its target/source ground station(s) 14 for only a fraction F of the orbit T. Thus, power consumption reduction during non active times is significant in that it means that if communications equipment power consumption can be terminated during these periods, the satellite's required power and thermal system capacities can be reduced.

Although many ways of terminating communications equipment power consumption during these no-service periods of the orbit have been considered previously, none has been able to achieve desired substantial efficiencies. For example, in the past, several methods that have been used to reduce power consumption, primarily by disabling the TWTAs. The most obvious and straightforward is to turn it off. This achieves the intended result, but the electronic power conditioner (EPC) units used to power the typical TWTA (see FIG. 3 for a simplified TWTA block diagram comprising an EPC and TWT) are complex and sensitive devices, so that subjecting them to the tens of thousands of on/off cycles required during the life of a satellite mission is a significant reliability risk considered unacceptable by most satellite customers.

Disabling the pre-amplifier used to drive the TWTA is another technique used to disable these devices. Unfortunately this does not prevent the TWTA from amplifying spurious noise power. Amplification of noise is undesirable because it creates a source of interference that degrades the signal of other active satellites. Additionally, disabling the driver amplifier only marginally reduces the TWTA power consumption and thermal dissipation. Therefore a satellite using it would require larger than desired power and thermal system capacity and is therefore for reasons mentioned earlier a more expensive system.

Biasing anode voltage is yet another method of disabling TWTA operation and reducing satellite power and thermal resource requirements. A substantial bias potential for the anode (~5700V for example) is required in order to be effective. Although possible to do, creating this high voltage signal is complex and expensive.

Since TWTAs contribute disproportionately to a satellite's power and thermal requirements—TWTAs typically consume around 90% of the power generated and distributed on a satellite and typically dissipate directly or indirectly about 70% of the heat that must be eliminated by the satellite's thermal control system—what is needed is a mechanism for providing more efficient implementations and designs for TWTA based amplifiers used in satellites, particularly NGSO satellite designs.

SUMMARY OF THE INVENTION

According to the invention, a traveling wave tube (TWT) amplifier in a spacecraft such as an orbiting satellite includes a beam forming electrode (BFE) and a BFE modulator having a bias-based keyer so that the TWT amplifier signals are keyed off during periods when RF power is not to be amplified. Biasing the beam forming electrode voltage off relative to cathode voltage effectively modulates or shuts down the electron beam so that low-level RF signal input is not amplified, and no significant RF power is output. It also does not require shutting down the power supply and thus reduces undesired power supply stress and improves reliability. The voltage required to bias off the BFE to eliminate RF output is for example a cutoff voltage of approximately less than 10% of that required for an anode-based biasing scheme or only about 500V below cathode potential. Likewise, given that no amplification has taken place, no power associated with the TWT amplification function is consumed. Thus, the only power consumed by the TWT amplifier is that associated with the cathode heater and the electronic power conditioner (EPC) used as the electron beam source.

A TWT amplifier according to the invention is readily applicable for deployment in a non-geosynchronous (NGSO) satellite, or a satellite whose orbital period is not equal to terrestrial orbit period. Teledesic, Global Radio, Landsat and Spot are examples of systems that are known to use NGSO satellites. Unlike geosynchronous satellites, these satellites move relative to fixed locations on the earth. For this reason, line-of-sight based communications are not possible for large portions of the satellite's orbit, so it is prudent and beneficial to shut off amplification functions during periods when the satellites are out of communication range with communication locations.

The invention will be better understood by reference to the following detailed description of the invention and the accompanying drawings.

DETAILED DESCRIPTION OF THE INVENTION

Figure 1:
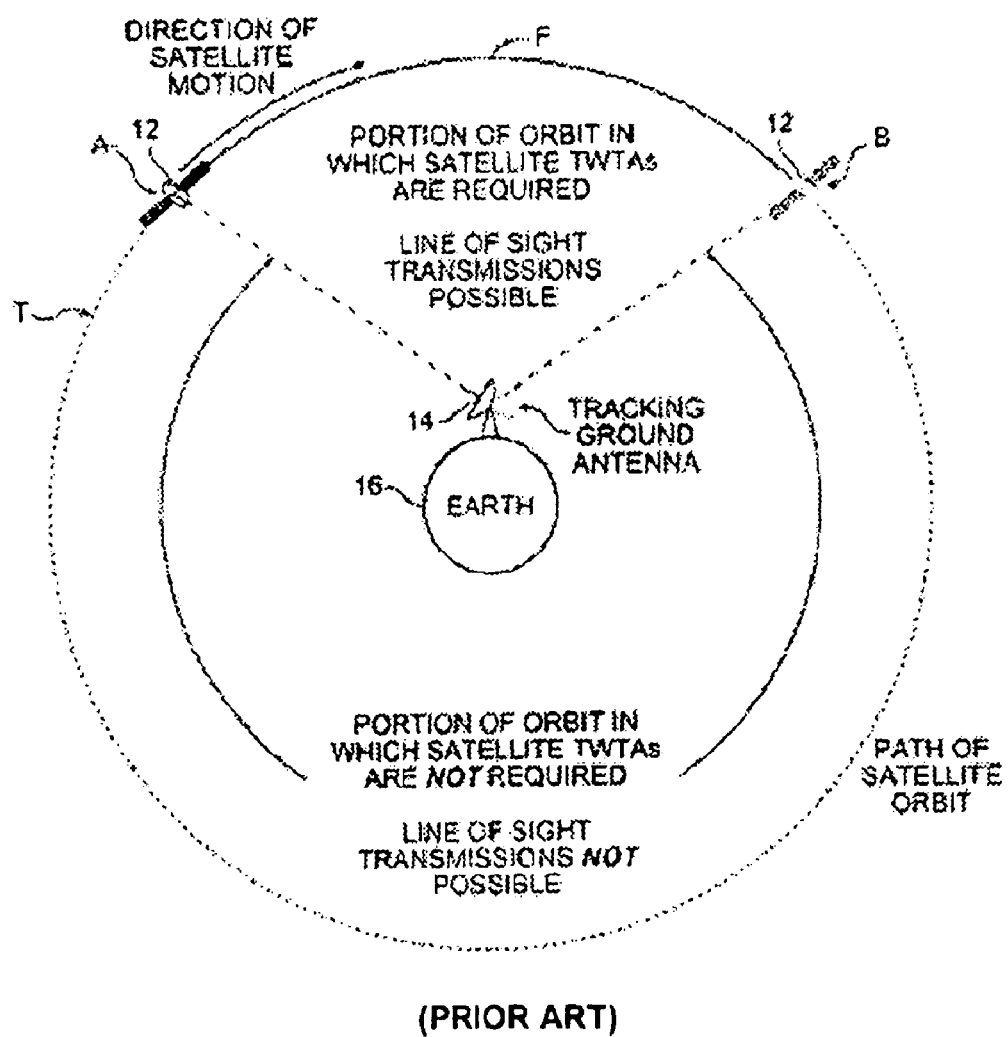
FIG. 1 illustrates characteristics of a non-geosynchronous (NGSO) satellite trajectory.
Figure 2A:
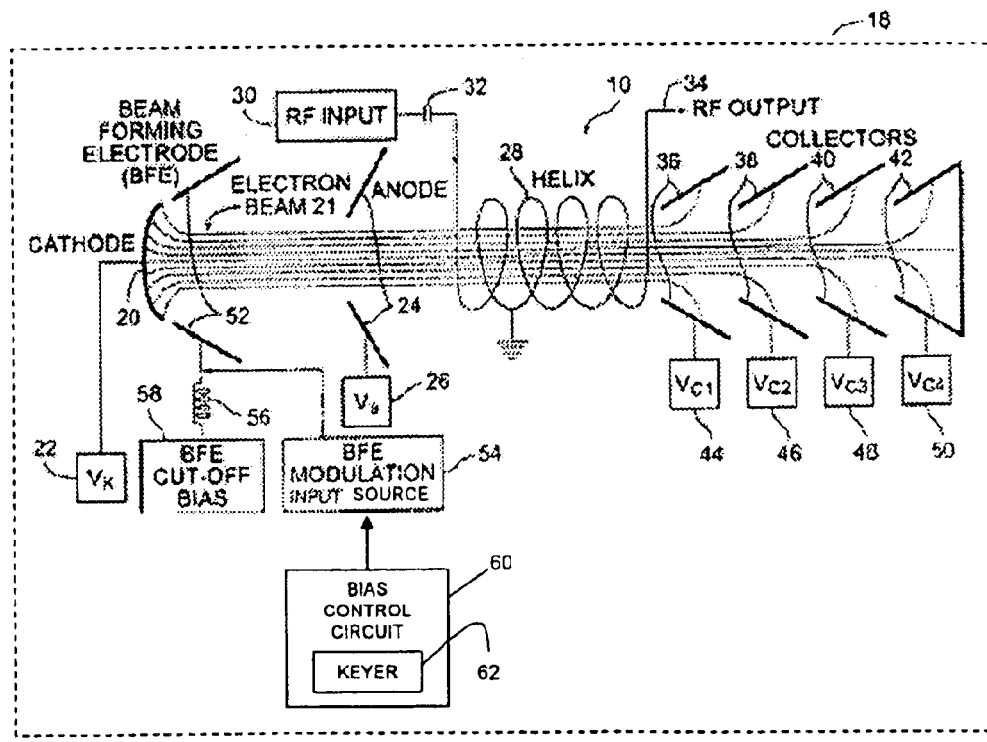
FIG. 2A is a schematic diagram of a traveling wave tube (TWT) according to the invention.
Figure 2B:
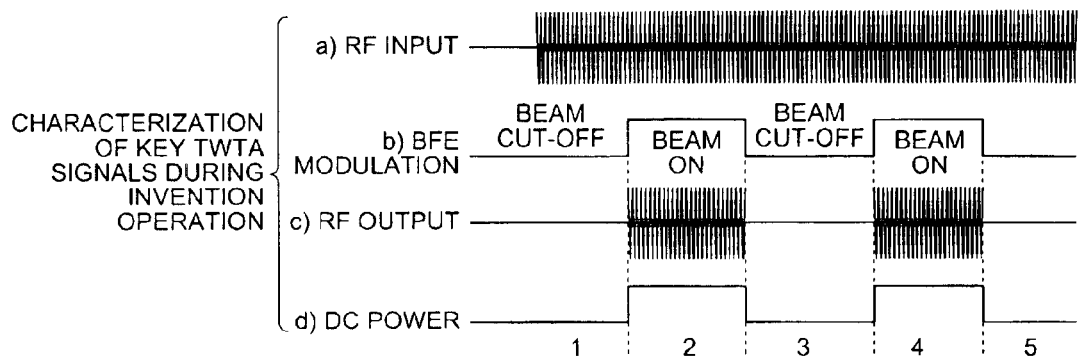
FIG. 2B is a timing diagram illustrating operation of a beam forming electrode modulator according to the invention.
Figure 3:
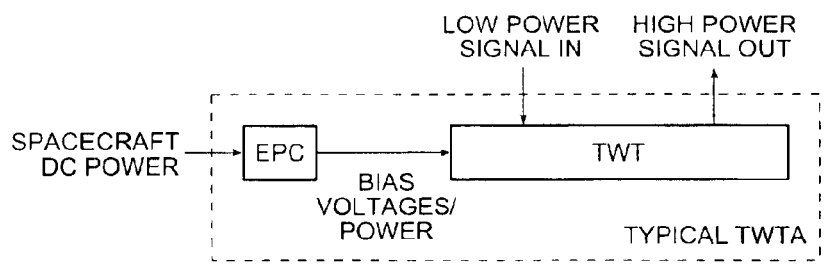
FIG. 3 is a simplified block diagram of a traveling wave tube amplifier according to the prior art.

FIG. 2A provides schematic diagram of a traveling wave tube (TWT) 10 according to the invention. FIG. 2B is a graphical representation of the principles underlying the invention. In FIG. 2A, the TWT 10, which is enclosed in a vacuum chamber (not shown) as part of a TWT amplifier 18 includes for example a circular or parabolic cathode surface 20 coupled to a first voltage source 22 that provides a source of electrons in an electron beam 21, a properly shaped anode 24 through which the electron beam passes and which is coupled to a second voltage source 26, a helix 28 through which the electron beam passes along a significant length and which is coupled to receive an RF modulation input signal from an RE input 30, typically via a coupling capacitor 32 which isolates the RE signal from the DC voltages, and produces an amplified RE output signal at an RE output terminal 34 which in turn is coupled to an antenna system (not shown). A series of collector electrodes 36, 38, 40 and 42 capture the electron beam 21 as it passes through them, each of which is coupled to a voltage source 44, 46, 48, 50. According to the invention, an appropriately shaped beam forming electrode (BFE) 52 is provided adjacent the cathode 20 which is in turn coupled directly to a BEE module input source 54 and via a choke 56 to a BFE cut-off bias source 58. The BFE modulation input source 54 is coupled to and controlled by a bias control circuit 60. The bias control circuit 60 controls the BFE modulation input source 54 in such a way that an adjustable bias voltage based on the BFE cut-off bias source 58 is provided to the BFE 52. The bias control circuit 60 may include a keyer 62 that is used to key off the TWT amplifier signals during periods when RF power is not to be amplified. By controlling the adjustable bias voltage, the electron beam from the BFE 52 can be turned on or off as desired. Based on the disclosure and teachings provided herein, a person of ordinary skill in the art should appreciate how to implement the bias control circuit according to the present invention. During normal operation, the beam-forming electrode (BFE) 52 serves to focus the electron beam into the traveling wave section of the TWT 10 and ultimately into the collectors 36, 38, 40, 42.

Referring to FIG. 2B, during periods of desired RF output (trace c, periods 2 and 4), the BFE 52 is held at a BFE bias voltage (trace b, periods 2 and 4) approximately equal to cathode voltage (Vk, ~6000V for example, for a 120–150W TWT). By biasing the beam forming electrode voltage off relative to cathode voltage, requiring for example 500V below cathode potential, the electron beam representing the bulk of DC power consumption is effectively shut down (trace d, periods 1, 3, 5). The low-level RF signal input is therefore not amplified, and no significant RF power is output (trace c, periods 1, 3, 5). Likewise, given that no amplification has taken place, no power is consumed by the TWT associated with the amplification function. Given this condition, the only power consumed by the TWTA is that associated with the cathode heater and EPC used as the electron beam source.

As an example of advantages, an exemplary NGSO system uses a constellation consisting of two or three planes of seven satellites providing coverage to twenty spot beam locations scattered around the globe. Because of the satellite's orbits and the diurnal variations telecommunications service demand, the average traffic through each satellite varies, but it is about a 23% activity level. In order to make a minimum cost satellite network, each satellite must be able to minimize power consumption/thermal dissipation during periods of reduced or non-existent communications systems demands.

In order to quantify the potential savings of this invention, three test cases assuming a representative satellite in the exemplary system have been simulated.

Case 1 is a configuration that envisions that all amplifiers on the satellite are left on regardless of the amount of traffic demand. This is the simplest design/operational mode.

Figure 4:
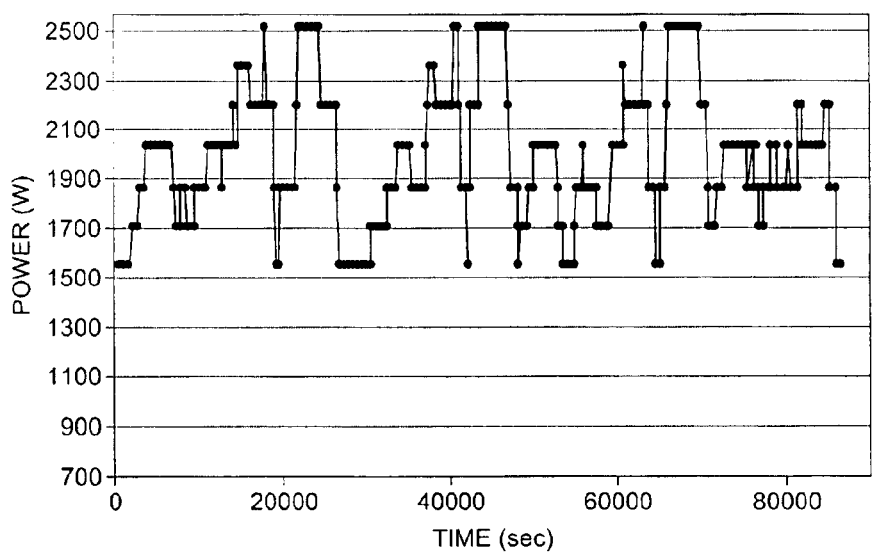
FIG. 4 is a diagram illustrating typical power demand of a satellite absent the present invention.

Case 2 envisions that the TWTA pre-amplifiers be turned off as a function of traffic demand and (lack of) line of sight visibility. FIG. 4 is a graphical illustration showing the satellite dc power demand profile for a satellite operating with this assumption.

Figures 5, 6:
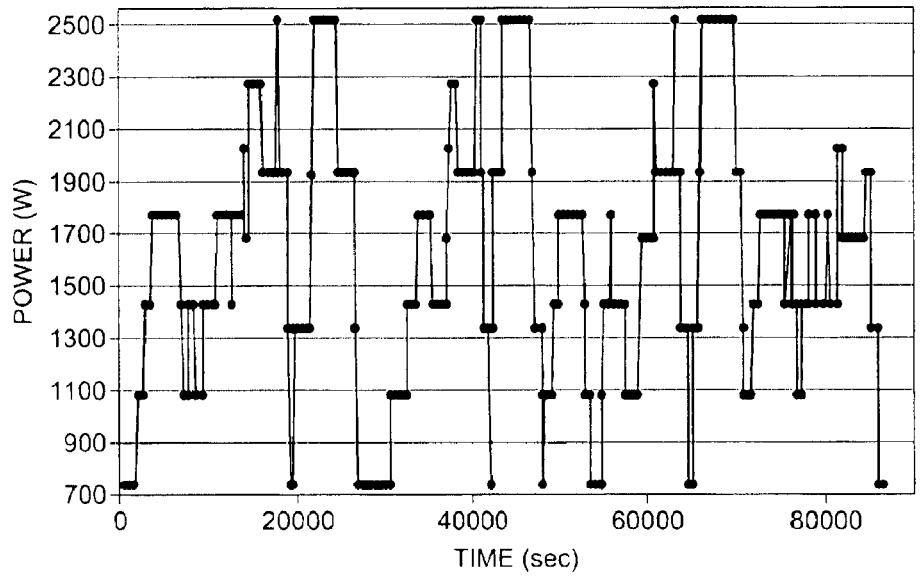
FIG. 5 is a diagram illustrating power demand of a satellite employing the present invention.
FIG. 6 is a table illustrating comparisons between power consumption with and without a TWTA operated in accordance with the invention in comparison with a prior art technique.

Case 3 envisions use of the subject invention. FIG. 5 is a graphical illustration showing the dc power demand profile for the same satellite with the invention in use.

As can be seen by comparing FIGS. 4 and 5, the minimum and average power demands required drop significantly when the invention is used (FIG. 5).

FIG. 6 provides a table that summarizes key power demand parameters for the various cases and summarizes the savings associated with the invention (Case 3).

Standard metrics can be used to estimate the cost savings associated with the invention relative to cases 1 and 2 as follows:

Cost savings due to reduced power required and therefore reduced spacecraft power subsystem equipment (batteries, solar arrays, electronics) can be estimated as assuming $1650 saved per Watt of average power saved. Based on this metric, the invention would save ~$1.5 million dollars per spacecraft relative to Case 1 and ~$0.65 million dollars per spacecraft relative to Case 2.

The mass savings associated with the smaller amount of power equipment required can be estimated using the metric 1 kg is saved for every 15 Watts of power saved. Based on this, the invention saves ~61 kg relative to Case 1 and 26 kg relative to Case 2.

As a consequence of reduced power consumption requirements, the amount of thermal waste heat the satellite thermal radiators need to be sized to eliminate is reduced. This results in some cost and mass savings.

For the purposes of this analysis, this factor has been ignored due to lack of a good metric.

Spacecraft mass directly affects the costs to put a satellite in operation in that the more massive a satellite, the more it costs to launch. The value of mass saved for a satellite launched into orbits can be estimated as ~$30,000/kg. Therefore, the invention saves $1.8 million per satellite in launch costs relative to Case 1 and ~$0.78 million per satellite in launch costs relative to Case 2.

Summing the savings per satellite associated with power system equipment and launch costs and multiplying it by the number of satellites required to operate a satellite network system as simulated (14), the total estimated savings amount associated with invention is $46 million relative to Case 1 and $20 million relative to Case 2.

The invention has now been explained with reference to specific embodiments. Other embodiments will be evident to those of ordinary skill in this art. Therefore the invention should not be limited, except as indicated by the appended claims.

What is claimed is:

1. In a spacecraft, a traveling wave tube amplifier system having a traveling wave tube for containing and producing an electron beam to amplify radio frequency signals, said traveling wave tube including a cathode structure for generating electrons, an anode structure, a collector structure for collecting said electrons, a helical coil disposed with a central axis along an electron beam path between anodes of said anode structure, a radio frequency source; a radio frequency output; and at least a first voltage source, said first voltage source coupled to said cathode structure, the improvement comprising:

a beam-forming electrode structure for forming said electron beam along said electron beam path between said cathode structure and said anode structure and said collector structure;

a modulation source coupled to said beam forming electrode structure to modulate electron emissions of said beam forming electrode structure;

a second voltage source d.c. coupled to said beam forming electrode structure for supplying a bias voltage relative to the first voltage source to the beam forming electrode structure; and a bias control circuit coupled to said modulation source to control said second voltage source for selectively adjusting said bias voltage so as to turn on or shut off the electron beam and thereby selectively suppressing output energy from the traveling wave tube amplifier during selected periods, so that, during said selected periods, low-level RF input signals are not amplified, no significant RE power is output from a satellite, and power is conserved.

2. The system according to claim 1 wherein said beam-forming electrode structure is disposed adjacent said cathode structure between said cathode structwre and said anode structure.

3. The system according to claim 1 wherein said bias control circuit comprises a keyer for keying on and off beam forming electrode voltages based on the first and second voltage sources and thereby to key on and off output signals of the traveling wave tube.

4. A traveling wave tube amplifier system having a traveling wave tube for containing and producing an electron beam to amplify radio frequency signals, said traveling wave tube including a cathode structure for generating electrons, an anode structure, a collector structure for collecting said electrons, a helical coil disposed with a central axis along an electron beam path between the anode structure and the collector structure, a radio frequency source; a radio frequency output; and a first voltage source coupled to said cathode structure, the improvement comprising:

a beam-forming electrode (BFE) structure for forming said electron beam along said electron beam path between said cathode structure and said anode structure;

a BFE modulation source coupled to said beam forming electrode structure for controlling an adjustable bias voltage supplied to the beam forming electrode structure, wherein said adjustable bias voltage is relative to said first voltaae source coupled to the cathode structure; and a bias control circuit coupled to said BFE modulation source for selectively adjusting said adjustable bias voltage so as to turn on or shut off the electron beam and thereby selectively suppressing output energy from the traveling wave tube amplifier during selected periods, so that, during said selected periods, low-level RF input signals are not amplified, no significant RF power is output from a satellite, and power is conserved.

5. The system according to claim 4 wherein said beam-forming electrode structure is disposed adjacent said cathode structure between said cathode structure and said anode structure.

6. The system according to claim 4 wherein said bias control circuit comprises a keyer for keying on and off beam forming electrode voltages and thereby to key on and off output signals of the traveling wave tube.

7. In a traveling wave tube amplifier system having a traveling wave tube for containing and producing an electron beam to amplify radio frequency signals, said traveling wave tube including a cathode structure for generating electrons, an anode structure, a collector structure for collecting said electrons, a helical coil disposed with a central axis along an electron beam path between the anode structure and the collector structure, a radio frequency source; a radio frequency output; and a first voltage source coupled to said cathode, a method for controlling the traveling wave tube amplifier system to conserve power and minimize amplification of spurious signals, wherein the improvement of the method comprising:

providing a beam-forming electrode (BFE) structure for forming said electron beam along said electron beam path between said cathode structure and said anode structure;

supplying an adjustable bias voltage to the beam forming electrode structure relative to the cathode structure under control of a BFE modulation source coupled to said beam forming electrode structure; and selectively adjusting said adjustable bias voltage so as to turn on or shut off the electron beam and thereby selectively suppressing output energy from the traveling wave tube amplifier during selected periods, so that, during said selected periods, low-level RF input signals are not amplified, no significant RF power is output from a satellite, and power is conserved.

8. In a non-geosynchronous orbit-type satellite with a traveling wave tube amplifier system having a traveling wave tube for containing and producing an electron beam to amplify radio frequency signals, said traveling wave tube including a cathode structure for generating electrons, an anode structure, a collector structure for collecting said electrons, a helical coil disposed with a central axis along an electron beam path between said anode structure, a radio frequency source; a radio frequency output; and at least a first voltage source, said first voltage source coupled to said cathode structure, a method for controlling the traveling wave tube amplifier system to conserve power and minimize amplification of spurious signals, wherein the improvement of the method comprising:

providing a beam-forming electrode (BFE) structure for forming said electron beam along said electron beam path between said cathode structure and said anode structure;

supplying an adjustable bias voltage to the beam forming electrode structure relative to the cathode structure under control of BFE modulation source coupled to said beam forming electrode structure; and selectively adjusting said adjustable bias voltage so as to turn on or shut off the electron beam and thereby selectively suppressing output energy from the traveling wave tube amplifier during selected periods, so that, during said selected periods, low-level RE input signals are not amplified, no significant RF power is output from the satellite, and power is conserved.

9. The method according to claim 8 wherein said electron beam is turned on only where a target earth station is in view of the satellite.

* * * * *

UNITED STATES PATENT AND TRADEMARK OFFICE
CERTIFICATE OF CORRECTION

PATENT NO. : 6,909,235 B2
DATED : June 21, 2005
INVENTOR(S) : Herbert J. Wolkstein et al.

It is certified that error appears in the above-identified patent and that said Letters Patent is hereby corrected as shown below:

Column 3,
Line 39, "RE input" should read -- RF input --.
Line 40, "RE signal" should read -- RF signal --.
Line 41, "RE output" (both occurences) should read -- RE output --.
Line 48, "BEE module" should read -- BFE module --.

Column 5,
Line 53, "RE power" should read -- RF power --.
Line 57, "structwre" should read -- structure --.

Column 6,
Line 16, "voltaae" should read -- voltage --.

Column 8,
Line 7, "RE input" should read -- RF input --.

Signed and Sealed this

Thirteenth Day of September, 2005

JON W. DUDAS
*Director of the United States Patent and Trademark Office*